(12) United States Patent
Katou et al.

(10) Patent No.: US 9,660,071 B2
(45) Date of Patent: May 23, 2017

(54) SEMICONDUCTOR DEVICE

(71) Applicant: KABUSHIKI KAISHA TOSHIBA, Tokyo (JP)

(72) Inventors: Hiroaki Katou, Nonoichi Ishikawa (JP); Tatsuya Nishiwaki, Komatsu Ishikawa (JP); Masatoshi Arai, Hakusan Ishikawa (JP); Hiroaki Katsuda, Kanazawa Ishikawa (JP); Chikako Yoshioka, Kanazawa Ishikawa (JP); Yoshitaka Hokomoto, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/059,267

(22) Filed: Mar. 2, 2016

(65) Prior Publication Data

US 2017/0062604 A1    Mar. 2, 2017

(30) Foreign Application Priority Data

Aug. 26, 2015   (JP) ................. 2015-166586

(51) Int. Cl.
| | |
|---|---|
| *H01L 29/66* | (2006.01) |
| *H01L 29/78* | (2006.01) |
| *H01L 29/06* | (2006.01) |
| *H01L 29/423* | (2006.01) |
| *H01L 29/40* | (2006.01) |

(Continued)

(52) U.S. Cl.
CPC ...... *H01L 29/7813* (2013.01); *H01L 29/0696* (2013.01); *H01L 29/0865* (2013.01); *H01L 29/0882* (2013.01); *H01L 29/1095* (2013.01); *H01L 29/407* (2013.01);

(Continued)

(58) Field of Classification Search
CPC ......... H01L 2924/0002; H01L 2924/00; H01L 29/0653; H01L 29/407; H01L 29/4236; H01L 29/4238; H01L 29/66734; H01L 29/7811; H01L 29/7813; H01L 21/26586; H01L 29/0619; H01L 29/0634; H01L 29/1095; H01L 29/7827; H01L 29/0696;
(Continued)

(56) References Cited

U.S. PATENT DOCUMENTS

| | | | |
|---|---|---|---|
| 7,531,871 B2 | 5/2009 | Omura et al. | |
| 7,679,136 B2 | 3/2010 | Kachi et al. | |

FOREIGN PATENT DOCUMENTS

JP        2008-227533 A      9/2008

*Primary Examiner* — Robert Bachner
(74) *Attorney, Agent, or Firm* — Patterson & Sheridan, LLP

(57) ABSTRACT

A semiconductor device includes a first semiconductor region of a first conductivity type, a second semiconductor region of a second conductivity type, a third semiconductor region of the first conductivity type, a conductive layer, a gate electrode, and a first electrode. The conductive layer includes a first portion, a second portion, and a third portion. The first portion is surrounded by the first semiconductor region via a first insulating portion. The second portion extends in a second direction, is provided on the first semiconductor region, and is provided on the second region. The third portion is connected between the first portion and the second portion and extends in a third direction. The first electrode is electrically connected to the third semiconductor region and the conductive layer. The second portion electrically connects the first electrode to the third portion.

20 Claims, 17 Drawing Sheets

(51) Int. Cl.
*H01L 29/08* (2006.01)
*H01L 29/10* (2006.01)

(52) U.S. Cl.
CPC .... *H01L 29/4236* (2013.01); *H01L 29/66734* (2013.01); *H01L 29/7811* (2013.01)

(58) Field of Classification Search
CPC ........... H01L 21/823487; H01L 27/088; H01L 27/11568
See application file for complete search history.

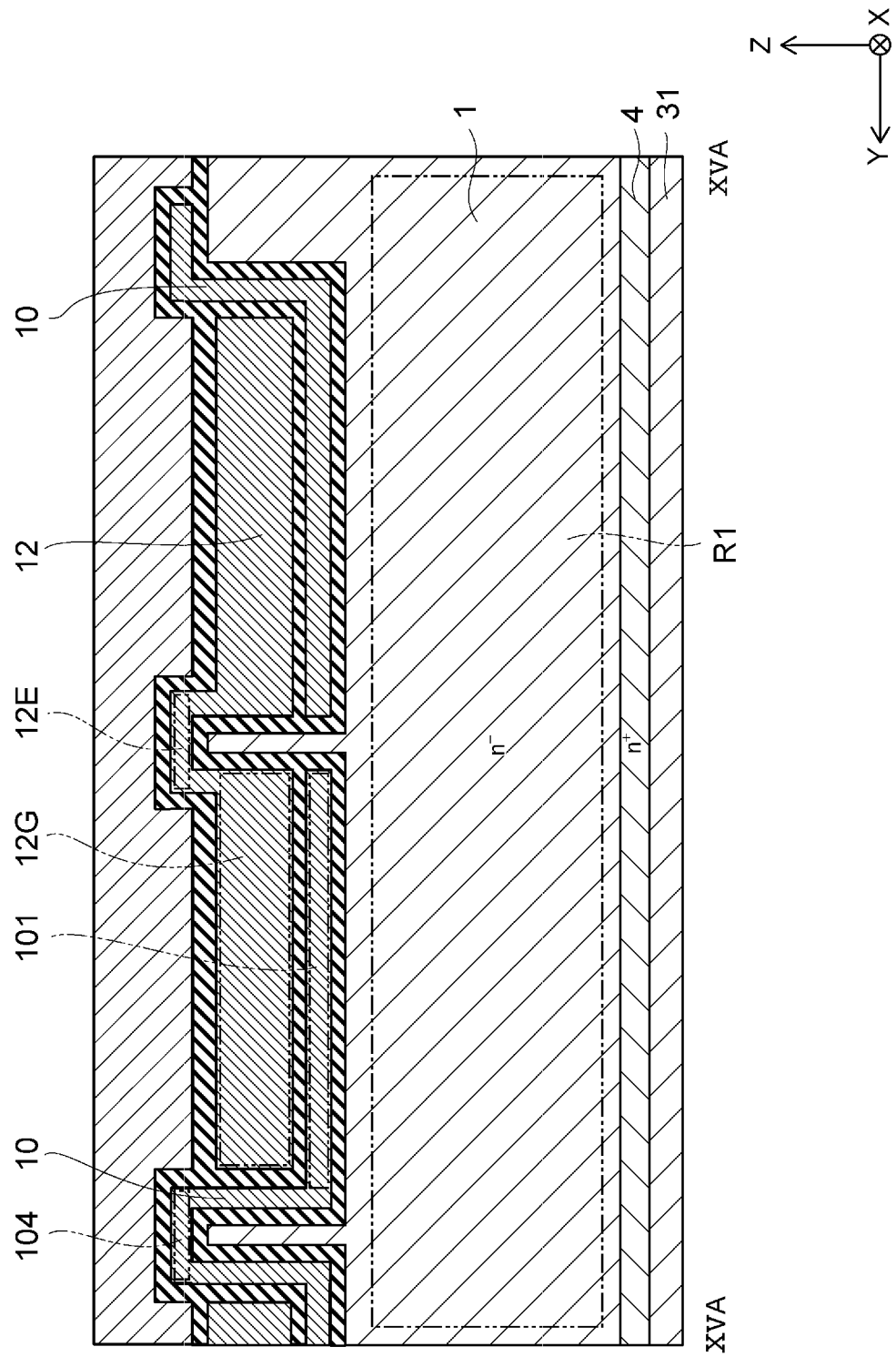

SEMICONDUCTOR DEVICE

CROSS-REFERENCE TO RELATED APPLICATION

This application is based upon and claims the benefit of priority from Japanese Patent Application No. 2015-166586, filed on Aug. 26, 2015, the entire contents of which are incorporated herein by reference.

FIELD

Embodiments described herein relate generally to a semiconductor device.

BACKGROUND

In a semiconductor device such as a metal oxide semiconductor field effect transistor (MOSFET), when the transistor is switched from an ON state to an OFF state, a surge voltage is generated in a drain electrode by self-inductance. At this time, the drain electrode vibrates and amplitude thereof decreases as time passes.

To prevent a semiconductor device or a circuit element connected to the semiconductor device from breaking down, it is preferable that the amplitude of the drain voltage be small when the surge voltage is generated. DESCRIPTION OF THE

DRAWINGS

FIG. 15 is a cross-sectional view taken along line XVA-XVA of FIG. 13.

DETAILED DESCRIPTION

Figure 1:
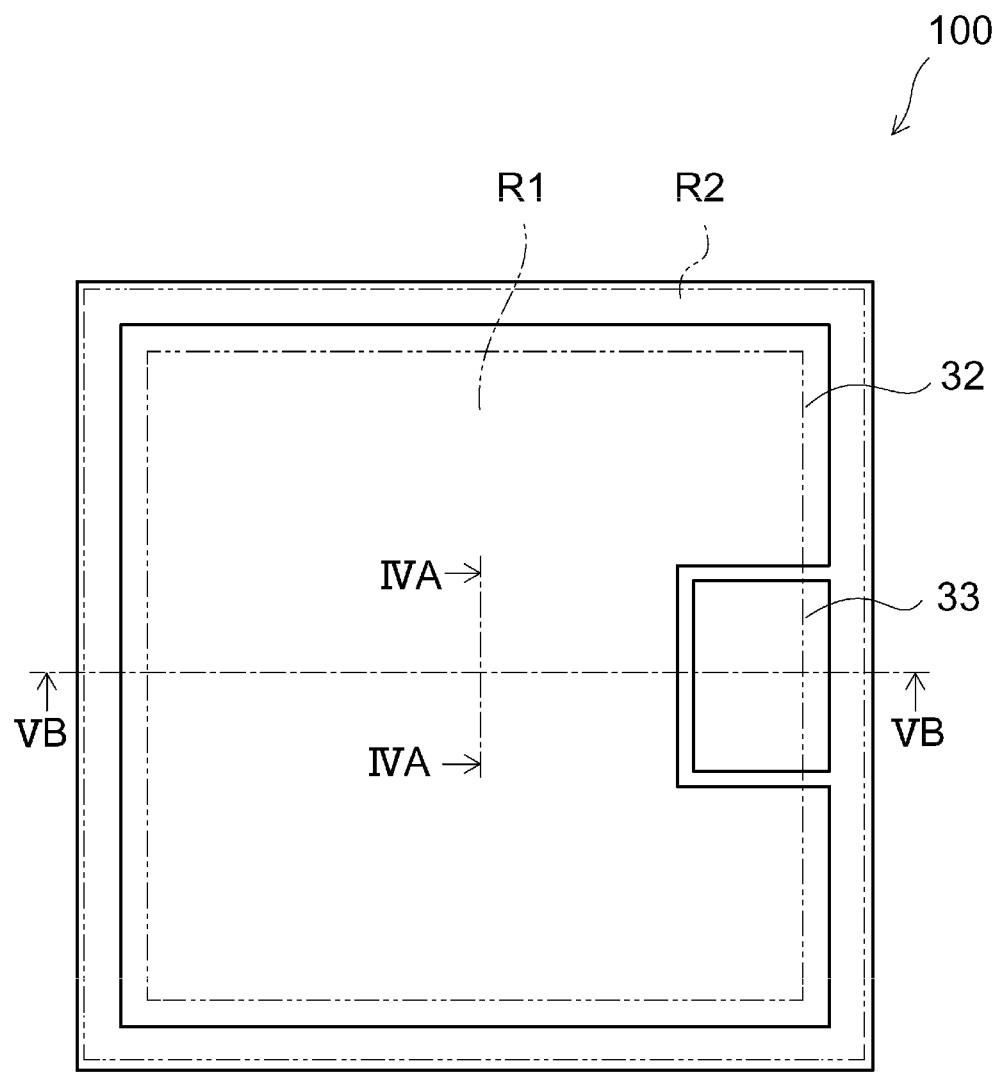
FIG. 1 is a plan view of a semiconductor device according to a first embodiment.

Embodiments provide a semiconductor device which can decrease amplitude of a drain voltage when a surge voltage is generated.

In general, according to one embodiment, a semiconductor device includes a first semiconductor region of a first conductivity type, a second semiconductor region of a second conductivity type, a third semiconductor region of the first conductivity type, a conductive layer, a gate electrode, and a first electrode.

The first semiconductor region includes a first region and a second region that is provided around the first region.

The second semiconductor region is provided on the first region.

The third semiconductor region is selectively provided on the second semiconductor region.

The conductive layer includes a first portion, a second portion, and a third portion.

The first portion is provided on the first region. The first portion is surrounded by the first semiconductor region via a first insulating portion.

The second portion is provided on the second region of the first semiconductor region and extends in a second direction perpendicular to a first direction toward the second semiconductor region from the first region.

The third portion is connected between the first portion and the second portion. The third portion extends in a third direction intersecting the first and second directions.

The gate electrode is provided on the first portion in a separated manner from the first portion. The gate electrode faces the second semiconductor region in the third direction via a second insulating portion.

The first electrode is provided on the conductive layer. The first electrode is electrically connected to the third semiconductor region and the conductive layer. The second portion electrically connects the first electrode to the third portion.

Hereinafter, embodiments of the present disclosure will be described with reference to the accompanying drawings.

The drawings are schematic and conceptual. In the drawings, a relationship between a thickness and a width of each portion, a size ratio between the portions, or the like are not necessarily the same as those in an actual device. In addition, even if the same portions or elements are illustrated in different drawings, dimensions and ratios may be illustrated differently from each other in the drawings.

In addition, in the present disclosure, the same symbols or reference numerals are attached to the same elements as described previously, and detailed description thereof will be appropriately omitted.

In the description of each embodiment, an XYZ orthogonal coordinate system is used. A direction toward a p-type base region 2 from a first region R1 is referred to as a Z-direction (first direction), and two directions which are perpendicular to the Z-direction and are orthogonal to each other are referred to as an X-direction (second direction) and a Y-direction (third direction).

In the following description, notation of $n^+$ and $n^-$ represents a relative level of impurity concentration of each conductivity type. That is, $n^+$ indicates that the impurity concentration of an n-type thereof is relatively higher than that of $n^-$.

In each embodiment which will be hereinafter described, each embodiment may be performed in a state in which p-type and n-type of each semiconductor region is reversed to each other.

First Embodiment

An example of a semiconductor device according to a first embodiment will be described with reference to FIGS. 1 to 5.

Figure 2:
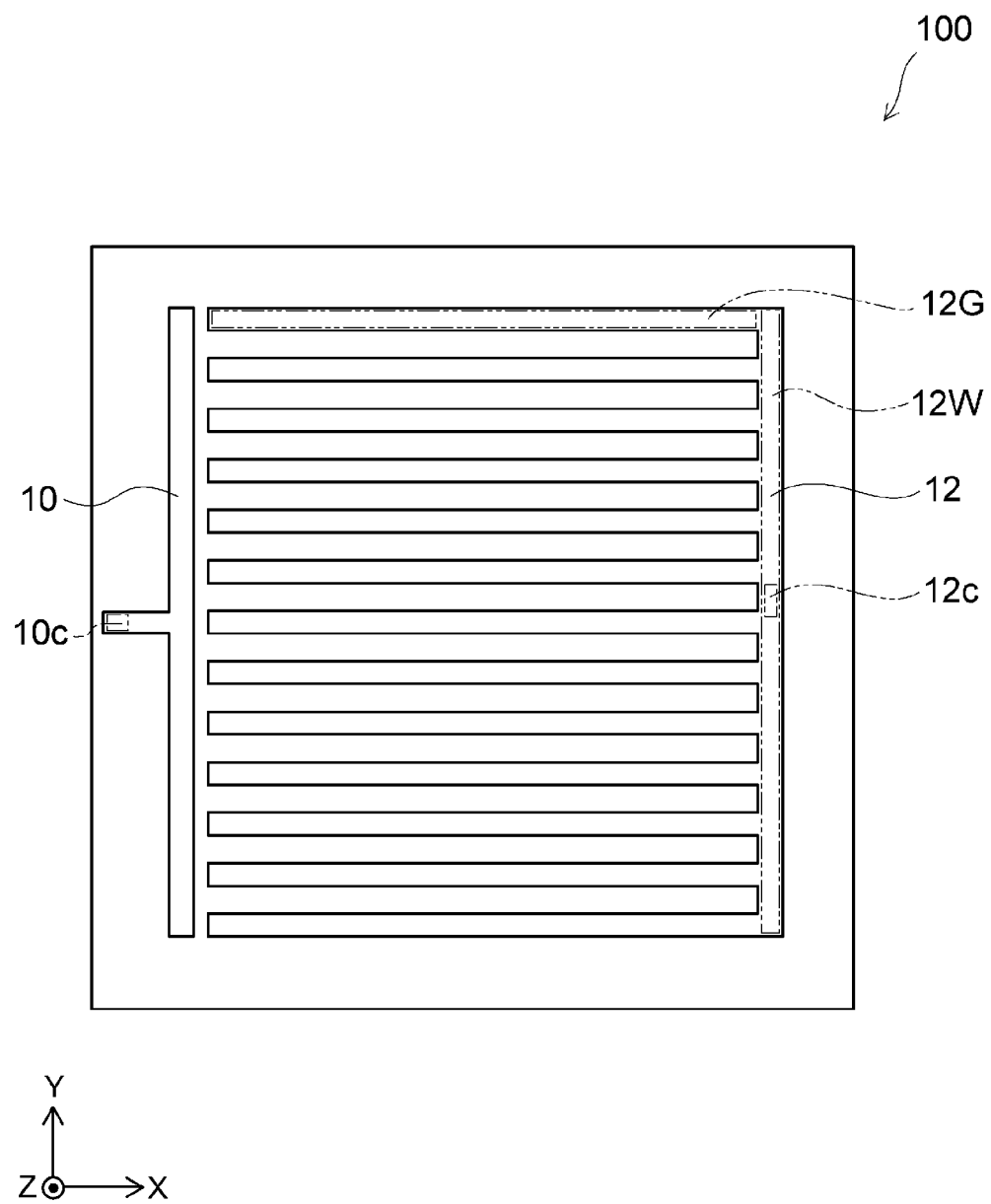
FIG. 2 is a plan view of the semiconductor device according to the first embodiment.
Figure 3:
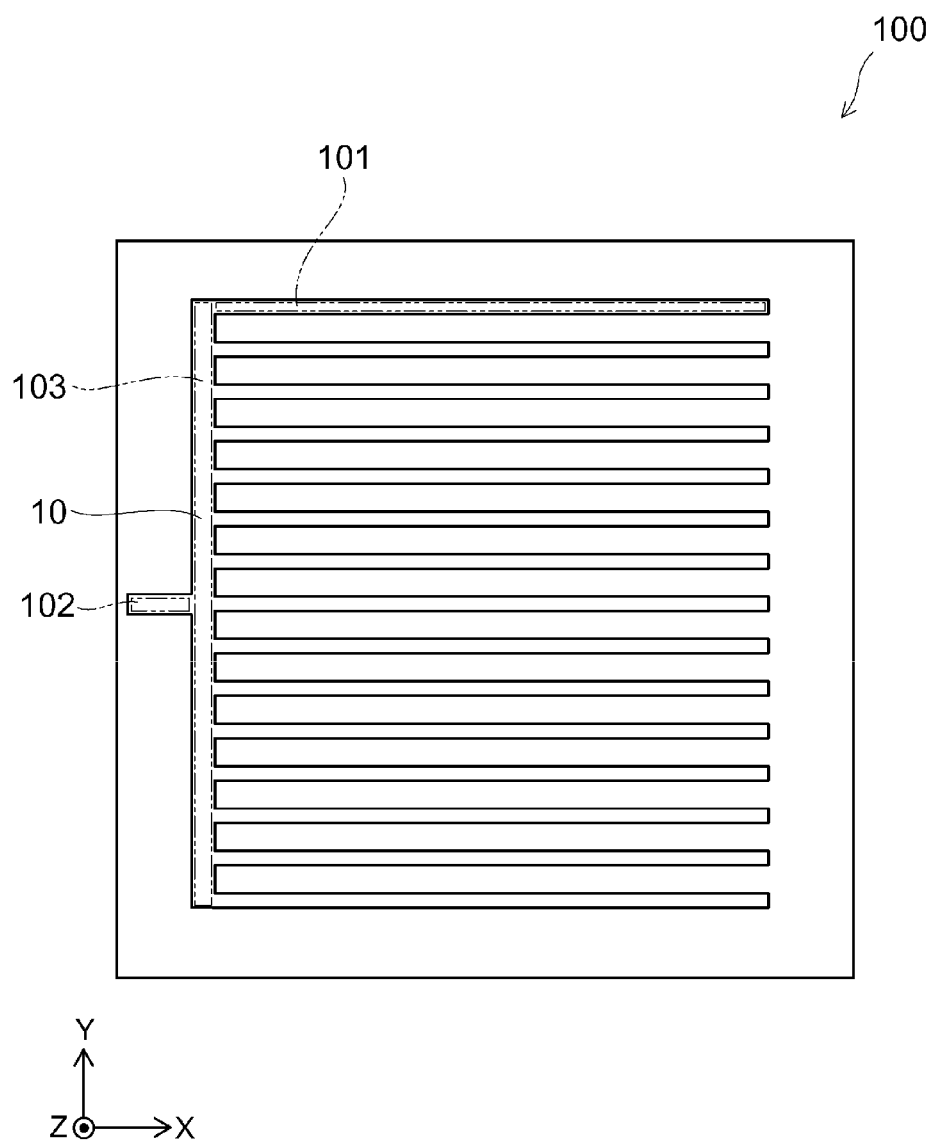
FIG. 3 is a plan view of the semiconductor device according to the first embodiment.

FIGS. 1 to 3 are plan views of a semiconductor device 100 according to the first embodiment.

Figure 4:
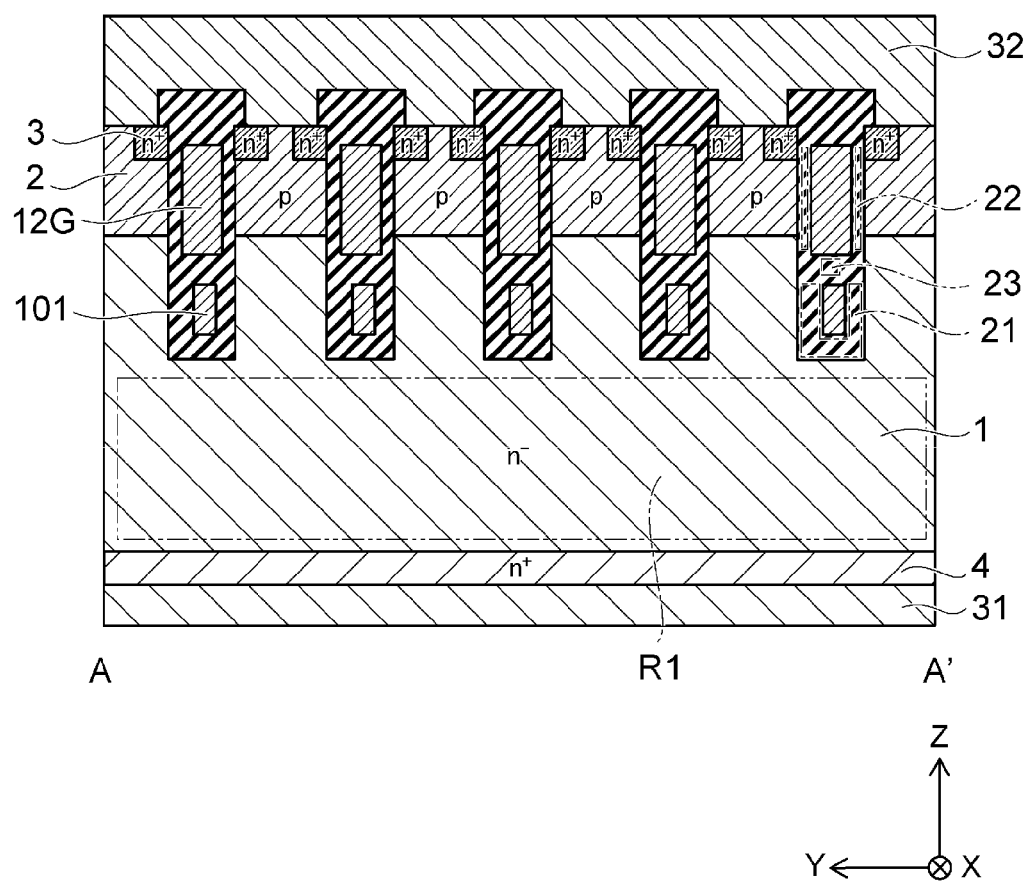
FIG. 4 is a cross-sectional view taken along line IVA-IVA of FIG. 1.

FIG. 4 is a cross-sectional view taken along line IVA-IVA of FIG. 1.

Figure 5:
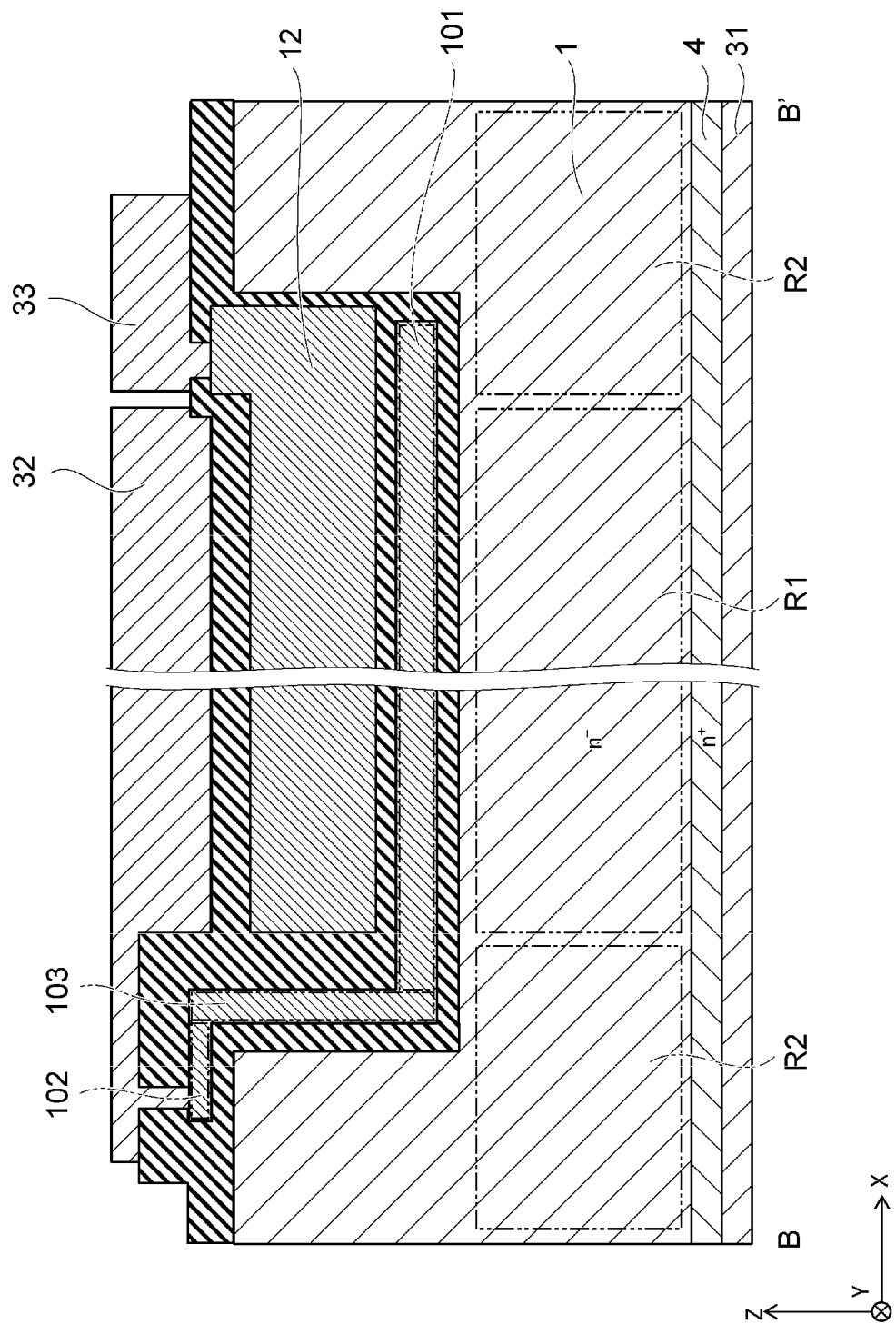
FIG. 5 is a cross-sectional view taken along line VB-VB of FIG. 1.

FIG. 5 is a cross-sectional view taken along line VB-VB of FIG. 1.

In FIG. 2 and FIG. 3, a source electrode 32 and a gate electrode pad 33 are omitted for purposes of explanation. Furthermore, in FIG. 2, an insulating portion which is positioned on a conductive layer 12 is also similarly omitted. In FIG. 3, an insulating portion, which is positioned on a conductive layer 10, and the conductive layer 12 is similarly omitted.

The semiconductor device 100 is, for example, an MOS-FET.

As illustrated in FIG. 1 to FIG. 5, the semiconductor device 100 includes an $n^+$-type (first conductivity type) drain region 4 (fourth semiconductor region), an $n^-$-type semiconductor region 1 (first semiconductor region), a p-type (second conductivity type) base region 2 (second semiconductor region), an $n^+$-type source region 3 (third semiconductor region), a conductive layer 10, a conductive layer 12, a first insulating portion 21, a second insulating portion 22, a third insulating portion 23, a drain electrode 31, a source electrode 32, and a gate electrode pad 33.

As illustrated in FIG. 1, the source electrode 32 and the gate electrode pad 33 are provided on an upper surface of the semiconductor device 100 in a separated manner.

In addition, the $n^-$-type semiconductor region 1 includes a first region R1 and a second region R2 provided around the first region R1. The first region R1 is a region which includes the center of the $n^-$-type semiconductor region 1 in the X-direction and the Y-direction.

As illustrated in FIG. 2, the conductive layer 10 and the conductive layer 12 are provided beneath the source electrode 32 and beneath the gate electrode pad 33. The conductive layer 10 is connected to the source electrode 32 in a connection portion 10c. The conductive layer 12 is connected to the gate electrode pad 33 in a connection portion 12c.

The conductive layer 12 includes a gate electrode 12G extending in the X-direction, and a gate wire 12W extending in the Y-direction. A plurality of the gate electrodes 12G are distributed along the Y-direction. An end portion of each of the gate electrodes 12G in the X-direction is connected to the gate wire 12W.

As illustrated in FIG. 3, the conductive layer 10 includes a first portion 101, a second portion 102, and a third portion 103.

A plurality of the first portions 101 are distributed along the Y-direction, and each of the first portions 101 extends in the X-direction. The second portion 102 extends in the X-direction. The third portion 103 extends in the Y-direction.

A position of the second portion 102 in the X-direction is placed between a position of the first portion 101 in the X-direction and a position of the third portion 103 in the X-direction. An end portion of the first portion 101 in the X-direction and an end portion of the second portion 102 in the X-direction are connected to the third portion 103. For this reason, the third portion 103 is connected between the first portion 101 and the second portion 102. The first portion 101 and the second portion 102 are electrically connected to each other through the third portion 103.

The first portion 101 and the third portion 103 may include p-type impurity or n-type impurity. In addition, the second portion 102 may include impurity or may be free of impurity, but it is preferable that an impurity concentration of the second portion 102 is lower than that of the first portion 101 and that of the third portion 103.

As illustrated in FIG. 4, the drain electrode 31 is provided on a lower surface of the semiconductor device 100. The $n^+$-type drain region 4 is provided on the drain electrode 31, and is electrically connected to the drain electrode 31. The $n^-$-type semiconductor region 1 is provided on the $n^+$-type drain region 4.

The p-type base region 2 is provided over the first region R1 of the $n^-$-type semiconductor region 1. The $n^+$-type source region 3 is selectively provided on the p-type base region 2.

A plurality of the p-type base regions 2 and a plurality of the $n^+$-type source regions 3 are distributed along the Y-direction, and respectively extend in the X-direction.

The first portion 101 of the conductive layer 10 is provided over the first region R1, and is surrounded by the $n^-$-type semiconductor region 1 through the first insulating portion 21. The gate electrode 12G is provided over the first portion 101. The gate electrode 12G faces the p-type base region 2 through the second insulating portion 22 in the Y-direction.

The third insulating portion 23 is provided between the first portion 101 and the gate electrode 12G, and the first portion 101 and the gate electrode 12G are separated from each other in the Z-direction.

An upper portion of the p-type base region 2 and an upper portion of the $n^+$-type source region 3 are electrically connected to the source electrode 32 provided over such regions.

An insulating portion is provided between the gate electrode 12G and the source electrode 32. The gate electrode 12G and the source electrode 32 are electrically isolated from each other.

As illustrated in FIG. 5, the second portion 102 and the third portion 103 are provided over the $n^-$-type semiconductor region 1, and are positioned over the second region R2. The third portion 103 extends in the Z-direction. The second portion 102 is connected to an end of the third portion 103 in the Z-direction, and the first portion 101 is connected to the other end of the third portion 103 in the Z-direction.

At least a portion of the second portion 102 is connected between the source electrode 32 and the third portion 103. That is, the first portion 101 and the source electrode 32 are electrically connected to each other through at least a portion of the second portion 102 and the third portion 103. As illustrated in FIG. 5, for example, a thickness of the second portion 102 in the Z-direction is less than that of the third portion 103 in the X-direction.

In a state in which a positive voltage is applied to the drain electrode 31 with respect to the source electrode 32, if a voltage higher than or equal to a threshold is applied to the gate electrode 12G, an MOSFET is turned on. At this time, a channel (inversion layer) is formed in a region near the second insulating portion 22 of the p-type base region 2.

In a state in which the MOSFET is turned off, when a potential which is positive with respect to a potential of the source electrode 32 is applied to the drain electrode 31, a depletion layer is expanded toward the $n^-$-type semiconductor region 1 from a boundary between the first insulating portion 21 and the n⁻-type semiconductor region 1. The reason is that the first portion 101 connected to the source electrode 32 is provided under the gate electrode 12G. As the depletion layer is expanded from the boundary between the first insulating portion 21 and the n⁻-type semiconductor region 1, voltage-resistance can be increased.

Here, an example of materials of each configuration element will be described.

The n⁺-type drain region 4, the n⁻-type semiconductor region 1, the p-type base region 2, and the n⁺-type source region 3 contain silicon, silicon carbide, gallium nitride, or gallium arsenide.

The conductive layer 10 and the conductive layer 12 contain a conductive material such as polysilicon.

N-type impurity such as, phosphorus, arsenic or antimony, or p-type impurity such as boron can be added to the first portion 101 and the third portion 103 of the conductive layer 10.

The first insulating portion 21 to the third insulating portion 23 each contain an insulating material such as silicon oxide.

The drain electrode 31, the source electrode 32, and the gate electrode pad 33 each contain a metal material such as aluminum.

Subsequently, an example of a manufacturing method of the semiconductor device according to the first embodiment will be described with reference to FIG. 6A to FIG. 10B.

FIGS. 6A and 6B, FIGS. 8A and 8B, FIG. 9, and FIGS. 10A and 10B are cross-sectional views illustrating manufacturing processes of the semiconductor device 100 according to the first embodiment.

Figure 7:
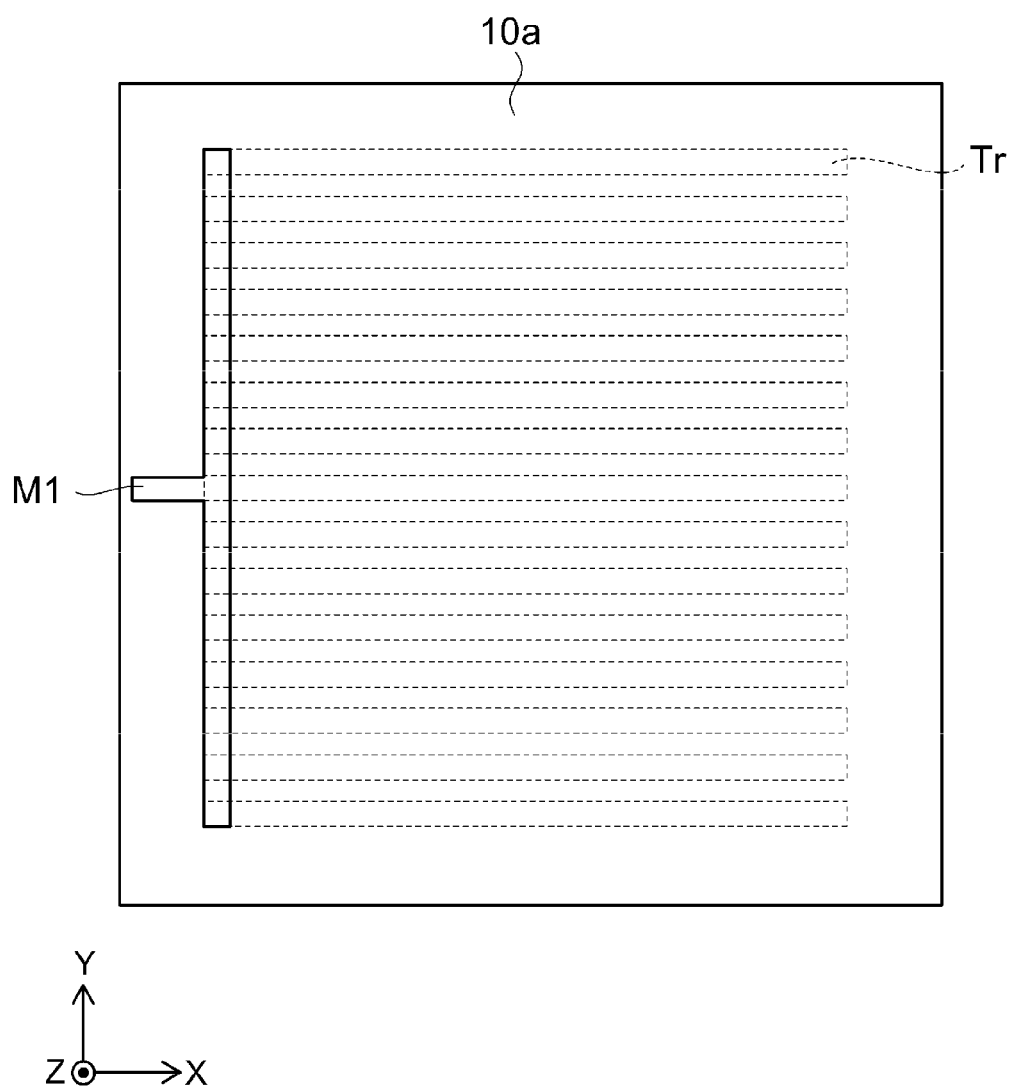
FIG. 7 is a plan view illustrating aspects of the manufacturing process of the semiconductor device according to the first embodiment.

FIG. 7 is a process plan view illustrating the manufacturing process of the semiconductor device 100 according to the first embodiment.

FIGS. 6A and 6B, FIGS. 8A and 8B, and FIGS. 10A and 10B are cross-sectional views at a position corresponding to a position to which line IVA-IVA of FIG. 1 is attached.

Figure 9:
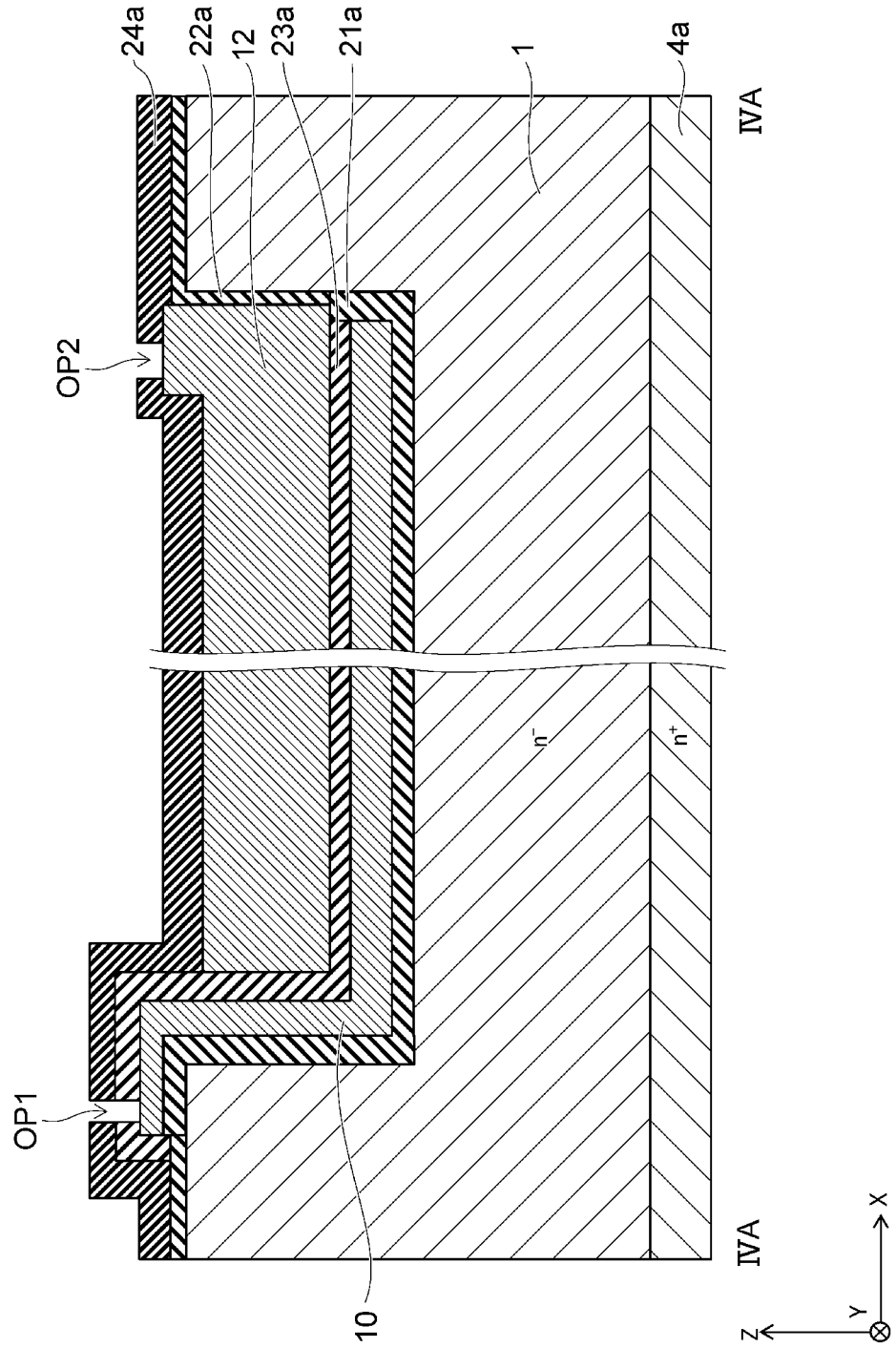
FIG. 9 is a cross-sectional view illustrating aspects of the manufacturing process of the semiconductor device according to the first embodiment.

FIG. 9 is a cross-sectional view at a position corresponding to a position to which line IVA-IVA of FIG. 1 is attached.

In the beginning, a semiconductor substrate in which an n⁻-type semiconductor layer 1a formed on an n⁺-type semiconductor layer 4a is prepared. Hereinafter, a case in which main components of the n⁺-type semiconductor layer 4a and the n⁻-type semiconductor layer 1a are silicon will be described as an example.

Figure 6A:
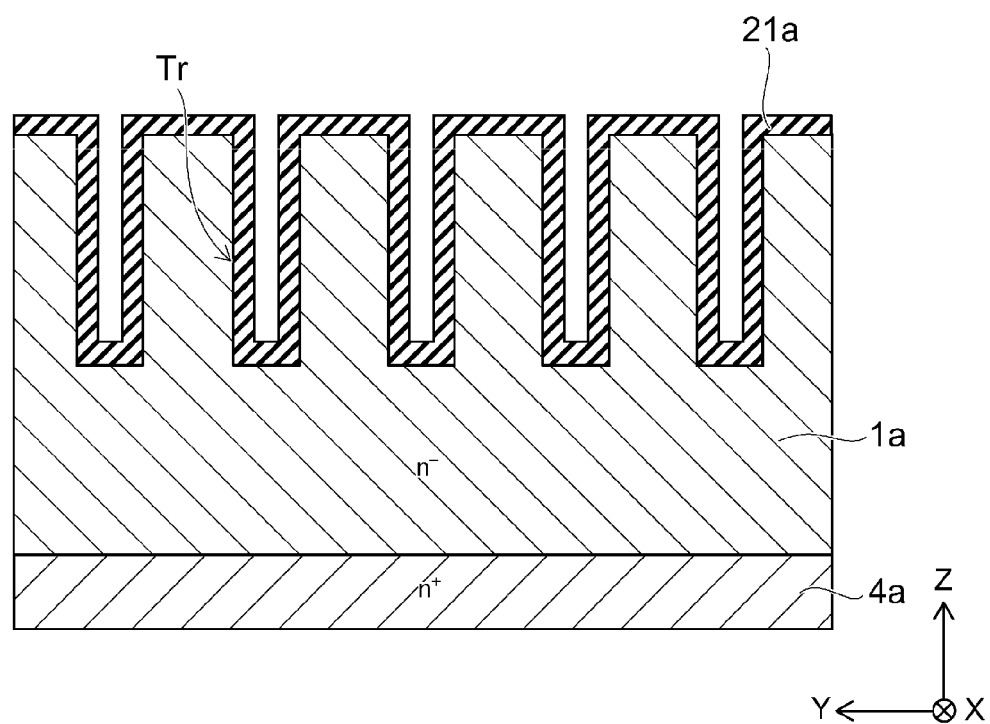
FIGS. 6A and 6B are cross-sectional views illustrating manufacturing processes of the semiconductor device according to the first embodiment.

Subsequently, a plurality of trenches Tr are formed on a surface of the n⁻-type semiconductor layer 1a. The plurality of trenches Tr are in parallel with each other in the Y-direction, and each trench Tr extends in the X-direction. Subsequently, the n⁻-type semiconductor layer 1a and an inner wall of the trench Tr are thermally oxidized, whereby an insulating layer 21a is formed, as illustrated in FIG. 6A. A silicon oxide layer may be further formed on the insulating layer 21a.

Subsequently, a conductive layer 10a is formed on the insulating layer 21a. Subsequently, a mask M1 which covers a portion of the conductive layer 10a is formed. The mask M1 is arranged on a position, which corresponds to the second portion 102 and the third portion 103 illustrated in FIG. 3, of the conductive layer 10a.

Figure 6B:
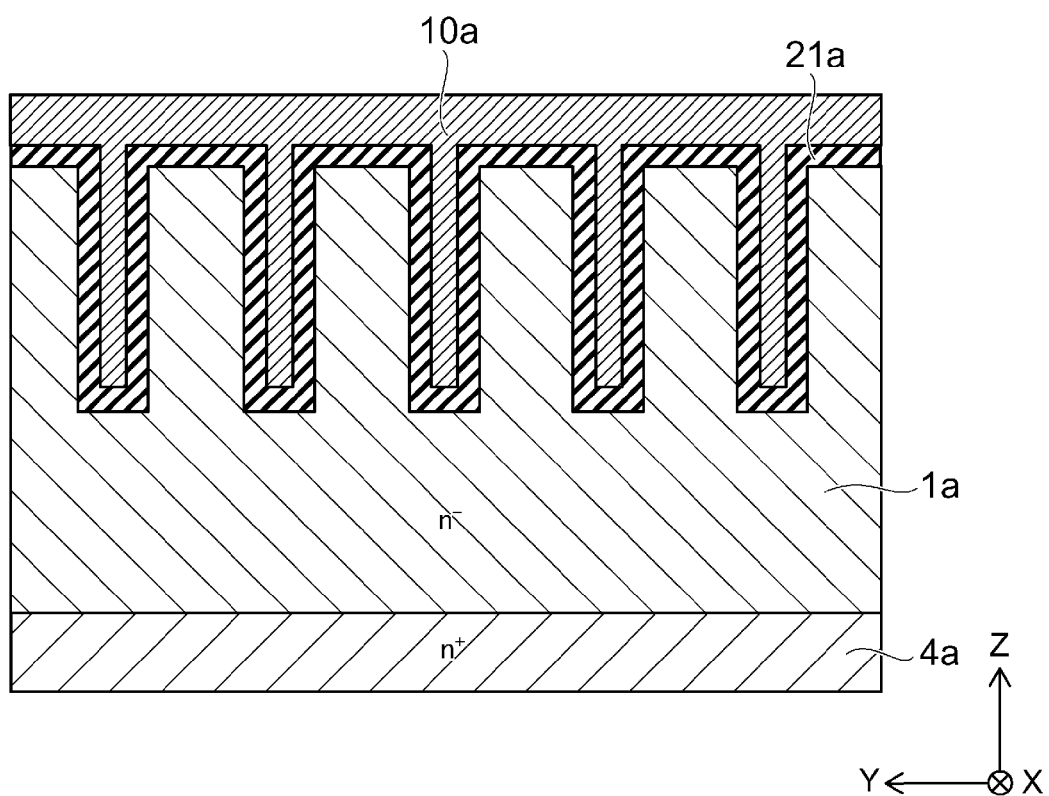

A state at this time is illustrated in FIG. 6B and FIG. 7. In FIG. 7, a position in which the trench Tr is formed is denoted by a dashed line.

Figure 8A:
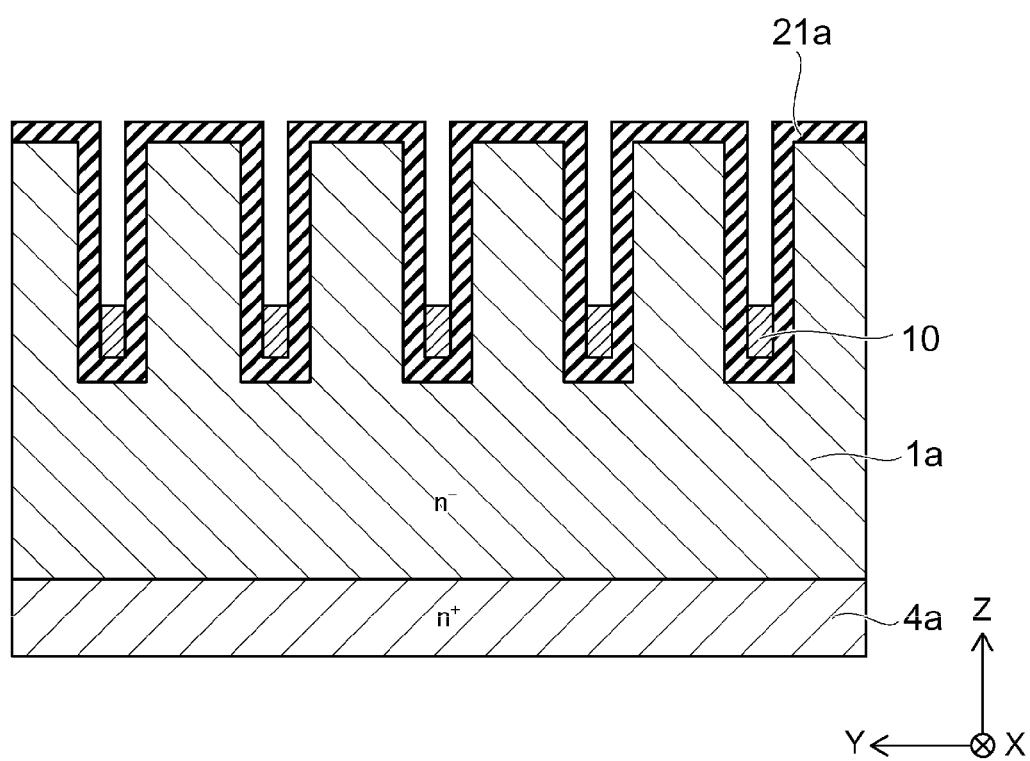
FIGS. 8A and 8B are cross-sectional views illustrating manufacturing processes of the semiconductor device according to the first embodiment.

Subsequently, a portion of the conductive layer 10a is removed by a reactive ion etching (RIE) method with using the mask. At this time, the RIE method is formed such that a portion of the conductive layer 10a remains inside the trench Tr, as illustrated in FIG. 8A. By this process, the conductive layer 10 including the first portion 101 to the third portion 103 is formed.

Thereafter, in a state in which the mask M1 is arranged, a layer containing p-type impurity or n-type impurity may be stacked on an upper surface of the first portion 101 and a side surface of the third portion 103. After the layer containing the impurity is stacked, thermal processing is performed, and thereby impurity is expanded inside the first portion 101 and the third portion 103. Accordingly, it is possible to reduce electrical resistance of such a portion.

Figure 8B:
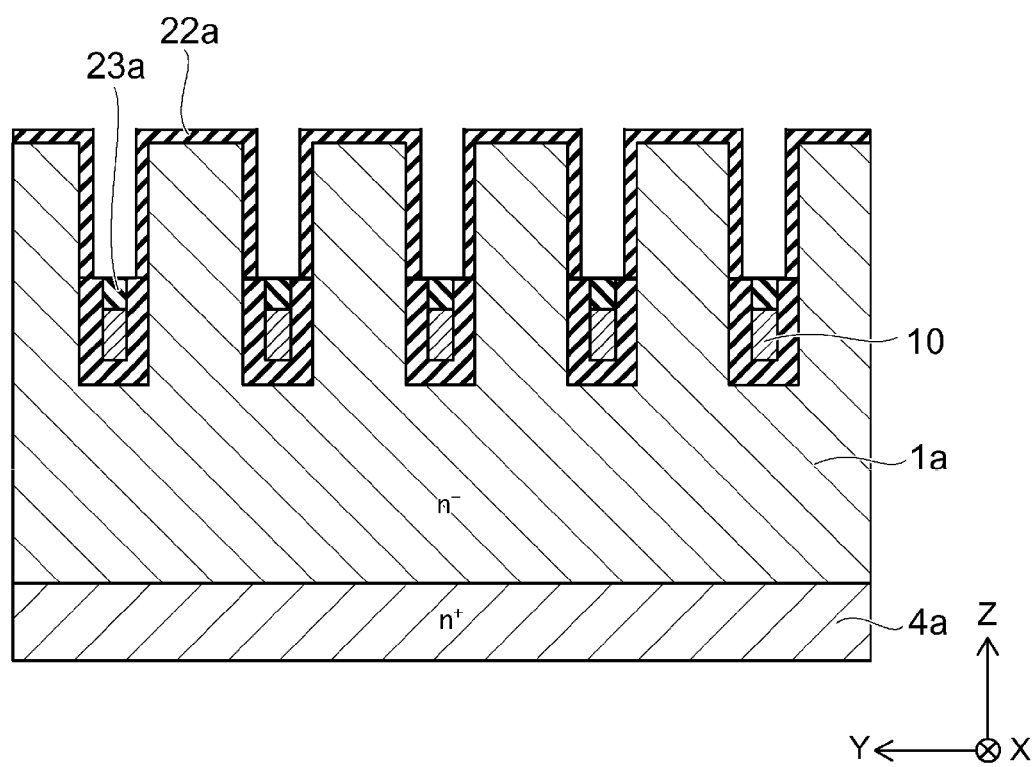

Subsequently, the mask M1 is removed, a surface of the conductive layer 10 is thermally oxidized, whereby an insulating layer 23a is formed. Subsequently, a portion of the insulating layer 21a is removed, and a portion of the trench Tr and a surface of the n⁻-type semiconductor layer 1a are exposed. The exposed surface is thermally oxidized, and thereby an insulating layer 22a is formed as illustrated in FIG. 8B. A thickness of the insulating layer 22a is less than that of, for example, the insulating layer 21a.

Subsequently, a conductive layer is formed on the insulating layer 22a and inside the trench Tr. The conductive layer is etched, whereby the conductive layer 12 including the gate wire 12W and the gate electrode 12G is formed.

Subsequently, ion injections of p-type impurity and n-type impurity are sequentially performed onto the surface of the n⁻-type semiconductor layer 1a, whereby the p-type base region 2 and the n⁺-type source region 3 are formed. At this time, portions, which is other than the p-type base region 2 and the n⁺-type source region 3, of the n⁻-type semiconductor layer 1a, corresponds to the n⁻-type semiconductor region 1.

Figure 10A:
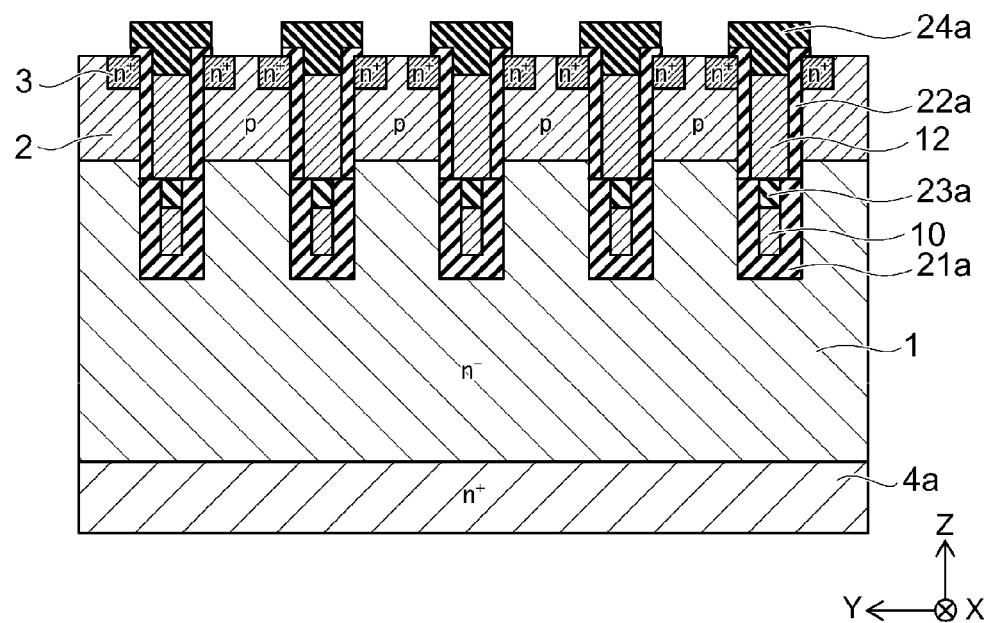
FIGS. 10A and 10B are cross-sectional views illustrating manufacturing processes of the semiconductor device according to the first embodiment.

Subsequently, an insulating layer 24a which covers the conductive layer 12 is formed, and then the insulating layers 22a and 24a are patterned as illustrated in FIG. 10A. At this time, as illustrated in FIG. 9, an opening OP1 and an opening OP2 are also formed in the insulating layer 24a in the same manner. A portion of the second portion 102 is exposed through the opening OP1, and a portion of the gate wire 12W is exposed through the opening OP2.

Subsequently, a metal layer which covers the p-type base region 2, the n⁺-type source region 3, and the insulating layer 24a is formed. At this time, a portion of the metal layer is formed inside the opening OP1 and the opening OP2, and is connected to the second portion 102 and the gate wire 12W. Subsequently, patterning of the metal layer is performed, and thereby the source electrode 32 and the gate electrode pad 33 are formed.

Figure 10B:
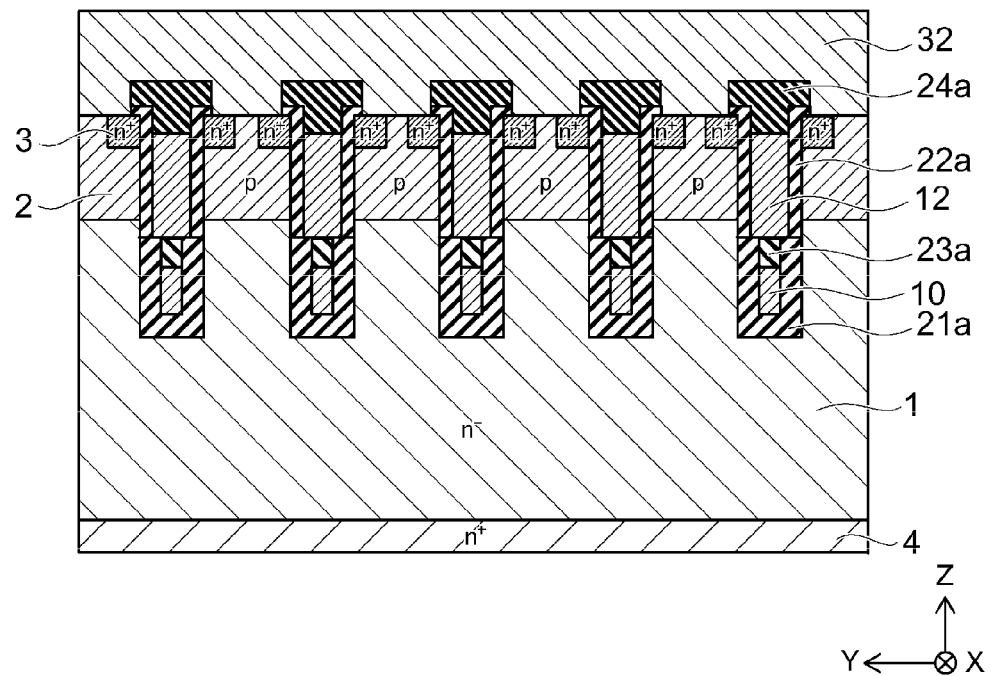

Subsequently, as illustrated in FIG. 10B, a rear surface of the n⁺-type semiconductor layer 4a is ground until the n⁺-type semiconductor layer 4a is thinned to a predetermined thickness. The n⁺-type drain region 4 is formed through this process.

Thereafter, the drain electrode 31 is formed on the rear surface of the n⁺-type drain region 4, whereby the semiconductor device 100 illustrated in FIG. 1 to FIG. 5 is formed.

Subsequently, operations and effects according to the present embodiment will be described.

According to the first embodiment, it is possible to reduce a vibration (oscillation) amplitude of a drain voltage when the semiconductor device is deactivated.

More specifically, in the semiconductor device according to the first embodiment, a portion of the conductive layer 10 connected to the source electrode 32 is provided under the gate electrode 12G. In this case, an electric resistance (resistor) R of the conductive layer 10 and a drain-source capacitance (capacitor) C are connected to each other between the drain electrode 31 and the source electrode 32. That is, an RC snubber circuit is connected in parallel with an MOSFET.

When the semiconductor device is turned off, a surge of voltage is generated in the drain electrode 31 by self-inductance. At this time, a current flows through the drain-source capacitor C, but a magnitude of the current is inversely proportional to the electric resistor R.

Here, in the semiconductor device according to the first embodiment, the conductive layer 10 includes the second portion 102. The second portion 102 extends in the X-direction, and is connected to the third portion 103 extended in a direction orthogonal to the X-direction. Thus, the source electrode 32 and the third portion 103 are electrically connected to each other through the second portion 102. For this reason, a current path between the source electrode 32 and the third portion 103 becomes narrower in the second portion 102. By employing such a configuration, the electric resistance between the source electrode 32 and the first portion 101 can increase, compared to, for example, a case in which the source electrode 32 and the third portion 103 are directly connected to each other without passing through the second portion 102.

As electric resistance between the source electrode 32 and the first portion 101 increases, it is possible to reduce a current flowing between the drain electrode 31 and the source electrode 32 through the conductive layer 10 when the semiconductor device is turned off. For this reason, according to the first embodiment, even though a surge voltage is generated in the drain electrode 31 and vibration of a drain voltage occurs, it is possible to decrease the amplitude thereof.

In addition, in the first embodiment, electric resistance between the third portion 103 and the source electrode 32 increases, whereby amplitude of a drain voltage, which is generated when a surge voltage is generated, is decreased. By employing such a configuration, the electric resistance between the third portion 103 and the source electrode 32 can be increased without increasing the electric resistance of the first portion 101 and the electric resistance of the third portion 103.

As described above, when the surge voltage is generated, a current flows through the conductive layer 10. For this reason, a current flowing through the first portion 101 increases, and a potential difference between the first portion 101 and the drain electrode 31 decreases. If the potential difference between the first portion 101 and the drain electrode 31 decreases, the depletion layer which is expanded toward the n$^-$-type semiconductor region 1 from the first portion 101 is reduced, and thus voltage-resistance of the semiconductor device decreases. If the voltage-resistance decreases, avalanche breakdown more easily occurs, and thus a current flowing between the source electrode 32 and the drain electrode 31 increases, and switching loss of the semiconductor device increases.

When a current flows through the conductive layer 10, the increasing amount of a potential of the first portion 101 is inversely proportional to the electric resistance of the first portion 101 and the electric resistance of the third portion 103. The reason is that, as the electric resistances of the first portion 101 and the third portion 103 decrease, voltage drop in the first portion 101 is reduced.

As described in the first embodiment, the second portion 102 is provided in the conductive layer 10, whereby resistance between the first portion 101 and the source electrode 32 increases. Accordingly, switching loss of the semiconductor device can be reduced, and amplitude of a drain voltage can be decreased.

In addition, the first portion 101 and the third portion 103 include p-type impurity or n-type impurity, and thus the electric resistances of the first portion 101 and the third portion 103 can be decreased. As the electric resistances of the first portion 101 and the third portion 103 are decreased, the amplitude of the drain voltage can be decreased, and the switching loss of the semiconductor device can be reduced.

At this time, since the electric resistance between the source electrode 32 and the third portion 103 increases, it is preferable that the second portion 102 does not contain impurity. If the second portion 102 contains impurity, however, it is preferable that impurity concentration of the second portion 102 is lower than that of the first portion 101 and that of the third portion 103.

Only one of the first portion 101 and the third portion 103 may contain impurity. The reason is that impurity is needed in only one of the first portion 101 and the third portion 103 to control the entire resistances of the first portion 101 and the third portion 103.

First Modification Example

Various shapes can be employed as the shape of the conductive layer 10, in addition to the example illustrated in FIG. 3.

Figure 11A:
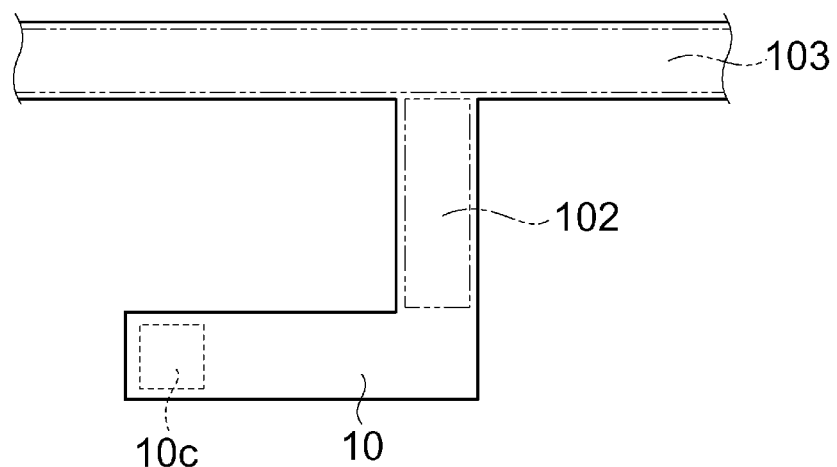
FIGS. 11A and 11B are partially enlarged plan views illustrating an example of a conductive layer.
Figure 11B:
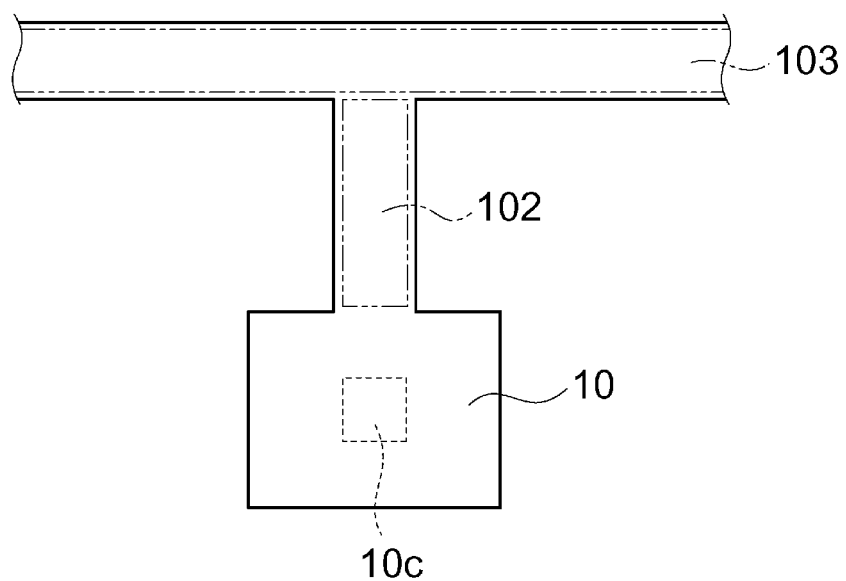

FIGS. 11A and 11B are partially enlarged plan views illustrating another example of the conductive layer 10. In FIGS. 11A and 11B, only the vicinity of the second portion 102 in the conductive layer 10 is illustrated in an enlarged manner.

As illustrated in FIG. 11A, the conductive layer 10 may include a curved portion between the connection portion 10c and the second portion 102.

In addition, as illustrated in FIG. 11B, a width of a portion having the connection portion 10c may be greater than that of the second portion 102.

In any configuration, at least a portion of the second portion 102 is connected between the source electrode 32 and the third portion 103, and thus electric resistance between the source electrode 32 and the third portion 103 can increase.

Second Modification Example

Figure 12:
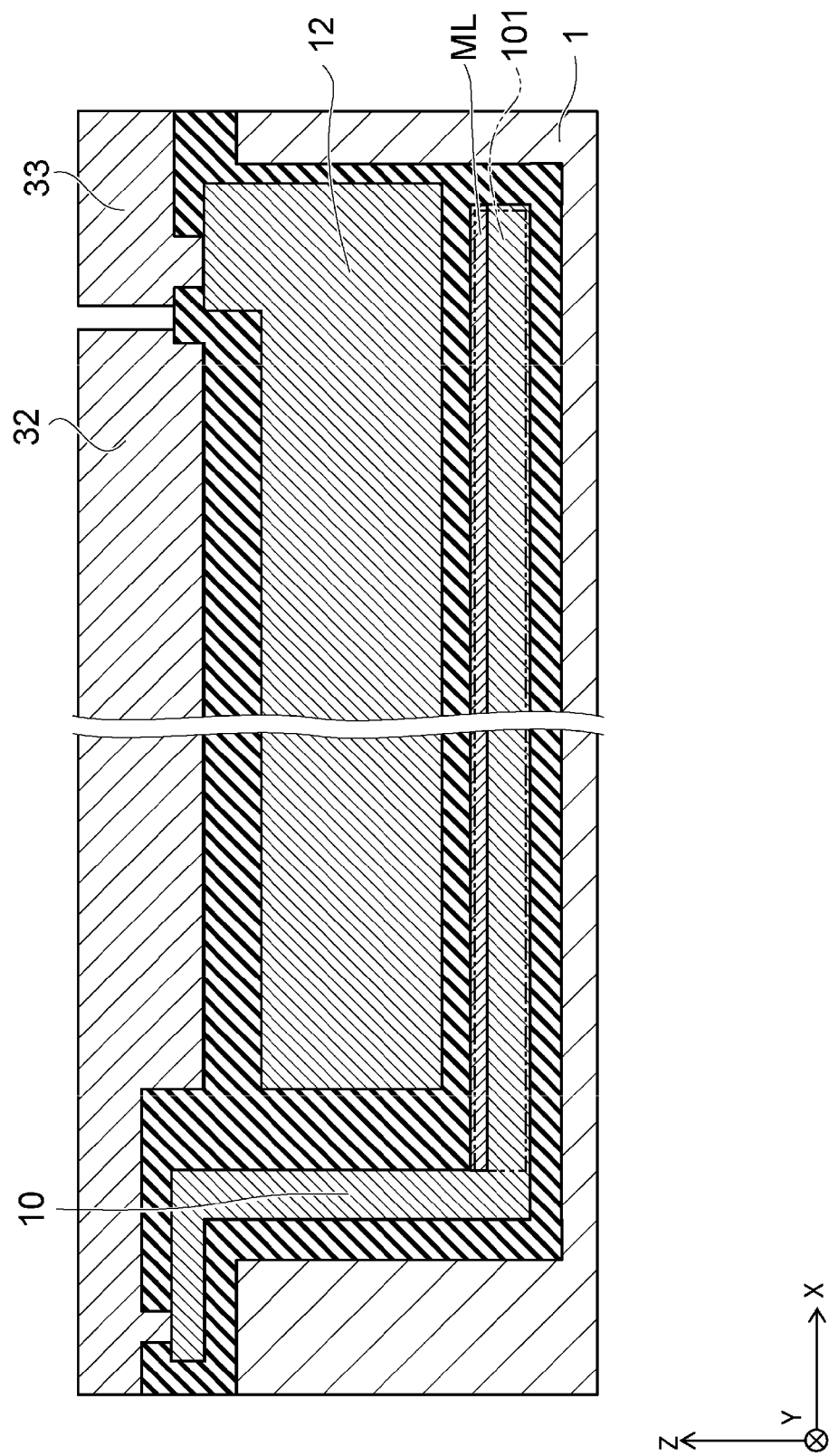
FIG. 12 is a partially enlarged sectional view illustrating an example of the conductive layer.

FIG. 12 is a partially enlarged sectional view illustrating another example of the conductive layer 10.

In FIG. 12, the vicinity of the conductive layers 10 and 12 is illustrated in an enlarged manner.

As illustrated in FIG. 12, the first portion 101 may include a metal layer ML, in addition to a layer including polysilicon. The metal layer ML contains a metal material such as tantalum, titanium, cobalt, and nickel.

The metal layer ML can be formed by stacking a metal material on the first portion 101 formed inside the trench Tr, after the conductive layer 10a is processed. At this time, a metal layer may be further formed on a side surface of the third portion 103.

In addition, the first portion 101 may include a silicide portion, instead of the metal layer ML. The silicide portion is formed by accumulating a metal material on the first portion 101 which is formed inside the trench Tr and thermally processing the accumulated metal material. Tantalum, titanium, cobalt, nickel, and the like can be used for the metal material for forming the silicide portion. At this time, a portion of the third portion 103 may be further silicided.

Since the first portion 101 includes a layer with low electric resistance, such as a metal layer or a silicide layer, the electric resistance of the entire first portion 101 can be decreased. As a result, it is possible to reduce vibration amplitude of a drain voltage, and to reduce power consumption of the semiconductor device.

Second Embodiment

An example of a semiconductor device according to a second embodiment will be described with reference to FIG. 13 to FIG. 15.

Figure 13:
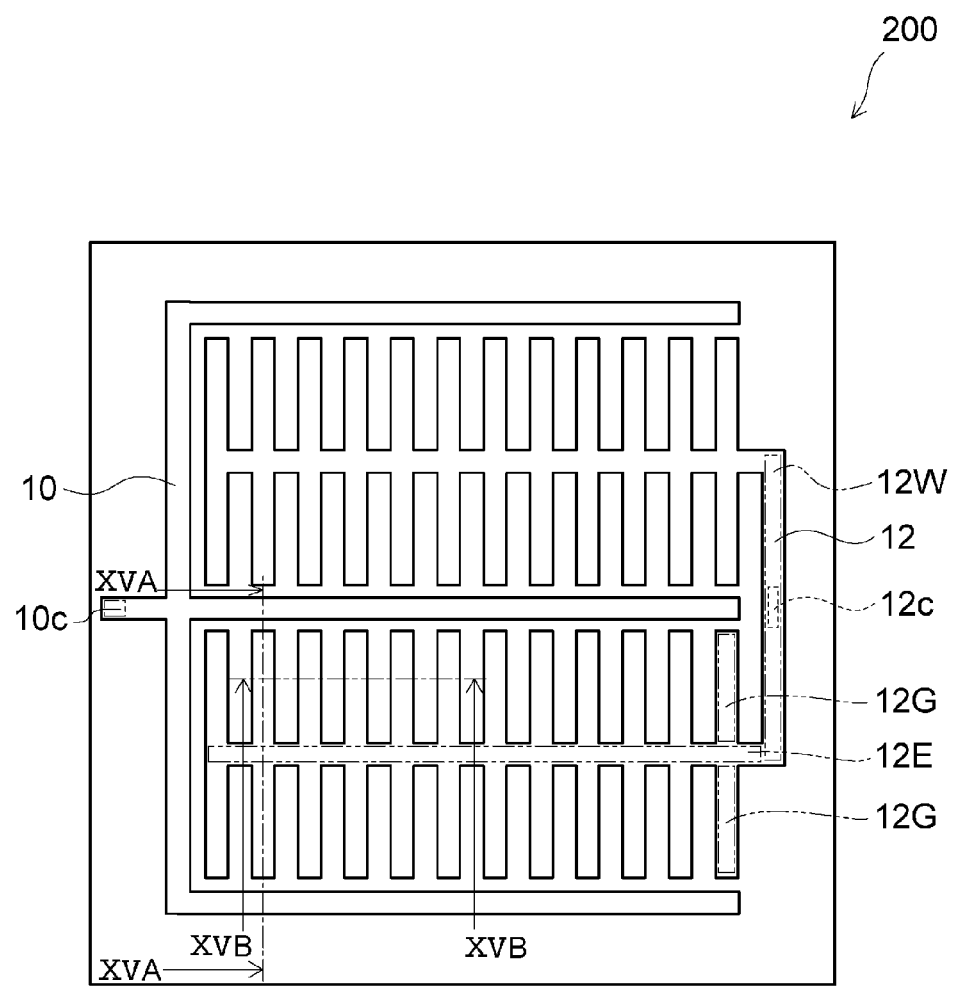
FIG. 13 is a plan view of a semiconductor device according to a second embodiment.
Figure 14:
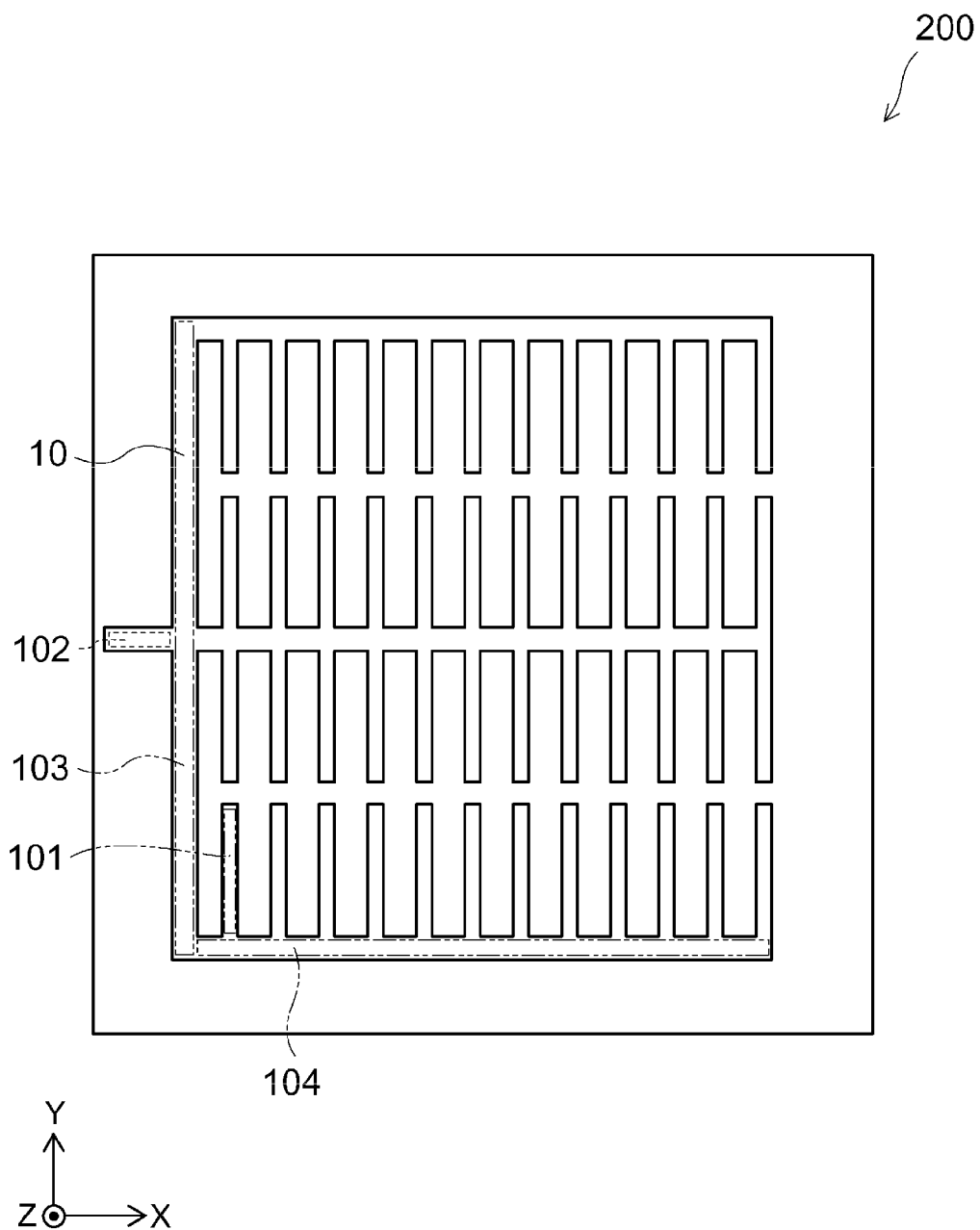
FIG. 14 is a plan view of the semiconductor device according to the second embodiment.

FIG. 13 and FIG. 14 are plan views of a semiconductor device 200 according to the second embodiment.

FIG. 15 is a sectional view taken along line XVA-XVA of FIG. 13.

In FIG. 13 and FIG. 14, the source electrode 32 and the gate electrode pad 33 are omitted. In addition, in FIG. 13, the insulating layer which is positioned on the conductive layer 12 is omitted. In FIG. 14, the insulating layer which is positioned on the conductive layer 12 and the conductive layer 10 is omitted.

The semiconductor device 200 according to the second embodiment is different from the semiconductor device 100, in structures of the conductive layers 10 and 12.

For example, a structure of a cross section taken along line XVB-XVB of FIG. 13 is the same as a structure of the cross section taken along line IVA-IVA of FIG. 1.

As illustrated in FIG. 13, the conductive layer 12 further includes an extension portion 12E which extends in the X-direction, in addition to the gate wire 12W and the gate electrode 12G.

The gate wire 12W and the gate electrode 12G extend in the Y-direction, and the extension portion 12E extends in the X-direction. A plurality of the extension portions 12E are distributed along the Y-direction, and an end portion of each extension portion 12E in the X-direction is connected to the gate wire 12W. A plurality of the gate electrodes 12G are distributed along the X-direction and the Y-direction, and an end portion of each gate electrode 12G in the Y-direction is connected to the extension portion 12E.

As illustrated in FIG. 14, the conductive layer 10 further includes a fourth portion 104 which extends in the X-direction, in addition to the first portion 101 to the third portion 103.

The first portion 101 and the third portion 103 extend in the Y-direction, and the second portion 102 and the fourth portion 104 extend in the X-direction. A plurality of the fourth portions 104 are distributed along the Y-direction, and an end portion of each fourth portion 104 in the X-direction is connected to the third portion 103. A plurality of the first portions 101 are distributed along the X-direction and the Y-direction, and an end portion of each first portion 101 in the Y-direction is connected to the fourth portion 104.

As illustrated in FIG. 15, the extension portion 12E and the fourth portion 104 are elevated more than the gate electrode 12G and the first portion 101.

In the present embodiment, it is also possible to reduce switching loss of the semiconductor device and to decrease amplitude of a drain voltage, in the same manner as in the first embodiment.

In each embodiment described above, it is possible to confirm a relative level of impurity concentration between the respective semiconductor regions, using, for example, a scanning capacitance microscope (SCM). A concentration of carriers in each semiconductor region can be regarded as being equal to an impurity concentration which is activated in each semiconductor region. Thus, it is also possible to confirm a relative level of the concentration of carriers between the respective regions, using the SCM.

As above, certain embodiments are described, but the embodiments are provided as examples, and are not intended to limit the scope of the disclosure. Such noble embodiments may be embodied by other various forms, and various omissions, replacements, or modifications can be made within a range without departing from the gist of the disclosure. It is possible for those skilled in the art to appropriately select a specific configuration of each element, such as, the $n^+$-type drain region 4, the $n^-$-type semiconductor region 1, the p-type base region 2, the $n^+$-type source region 3, the conductive layer 12, the first insulating portion 21, the second insulating portion 22, the third insulating portion 23, the drain electrode 31, the source electrode 32, and the gate electrode pad 33, which are included in the embodiment, from the known technology. The embodiments or the modifications are included in the scope or the gist of the disclosure, and are included in the disclosure set forth in the appended claims and the scope of its equivalents. In addition, each embodiment described above may be performed by combining those with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first semiconductor region of a first conductivity type including a first region and a second region surrounding the first region;
   a second semiconductor region of a second conductivity type on the first region of the first semiconductor region;
   a third semiconductor region of the first conductivity type on a portion of the second semiconductor region;
   a conductive layer including:
      a first conductive portion on the first region of the first semiconductor region, a first insulating portion being between the first conductive portion and the first semiconductor region,
      a second conductive portion on the second region of the first semiconductor region and extending in a second direction, which is perpendicular to a first direction, towards the second region from the first region, and
      a third conductive portion between the first conductive portion and the second conductive portion and extending in a third direction intersecting the first and second directions;
   a gate electrode disposed above the first conductive portion in the third direction, the first insulating portion being between the gate electrode and the first conductive portion in the third direction, the gate electrode facing the second semiconductor region with a second insulating portion being between the gate electrode and the second semiconductor region; and a first electrode above the conductive layer in the third direction and electrically connected to the third semiconductor region and the conductive layer, the second conductive portion electrically connecting the first electrode to the third conductive portion.

2. The semiconductor device according to claim 1,
wherein the first conductive portion and the gate electrode extend in the second direction, and
wherein an end portion of the first conductive portion disposed at an end of the first conductive portion along the second direction is connected to the third conductive portion.

3. The semiconductor device according to claim 2, wherein the second conductive portion extends in the second direction to a position along the second direction that is beyond the third conductive portion and the end of the first conductive portion along the second direction.

4. The semiconductor device according to claim 1,
wherein the first conductive portion includes an impurity of the first conductivity type or the second conductivity type, and
wherein the second conductive portion does not include the impurity.

5. The semiconductor device according to claim 1,
wherein the first conductive portion and the second conductive portion include an impurity of the first conductivity type or the second conductivity type, and
wherein a concentration of the impurity in the first conductive portion is greater than a concentration of the impurity in the second conductive portion.

6. The semiconductor device according to claim 1,
wherein the conductive layer further includes a fourth conductive portion that extending in the second direction,
wherein an end portion of the fourth conductive portion disposed at an end of the fourth conductive portion along the second direction is connected to the third conductive portion, and
wherein the first conductive portion is connected to the fourth conductive portion.

7. The semiconductor device according to claim 1, wherein a thickness of the second conductive portion along the first direction is less than a thickness of the third conductive portion along the second direction.

8. The semiconductor device according to claim 1, wherein an electrical resistance of the second conductive portion is greater than an electrical resistance of the third conductive portion.

9. The semiconductor device according to claim 8, wherein a thickness of the second conductive portion along the first direction is less than a thickness of the third conductive portion along the second direction.

10. The semiconductor device according to claim 1, wherein the conductive layer includes silicon and metal.

11. A semiconductor device, comprising:
a first semiconductor region of a first conductivity type including a first region and a second region surrounding the first region in a first plane;
a second semiconductor region of a second conductivity type on the first region of the first semiconductor region;
a third semiconductor region of the first conductivity type on a portion of the second semiconductor region;
a conductive layer including:
a first conductive portion on the first region of the first semiconductor region and surrounded by the first semiconductor region with a first insulating portion being between the first conductive portion and the first semiconductor region,
a second conductive portion on the second region of the first semiconductor region and extending in a second direction that is parallel to the first plane and perpendicular to a first direction, which is also parallel to the first plane, and
a third conductive portion connected between the first conductive portion and the second conductive portion, an electrical resistance through the second conductive portion being greater than an electrical resistance through the third conductive portion;
a gate electrode disposed above the first conductive portion in a third direction crossing the first plane, the first insulating portion being between the gate electrode and the first conductive portion in the third direction, the gate electrode facing the second semiconductor region with a second insulating portion being between the gate electrode and the second semiconductor region; and
a first electrode above the conductive layer in the third direction and electrically connected to the third semiconductor region and the conductive layer, the second conductive portion electrically connecting the first electrode to the third conductive portion.

12. The semiconductor device according to claim 11,
wherein the first conductive portion and the gate electrode extend in the second direction, and
wherein an end portion of the first conductive portion disposed at an end of the first conductive portion along the second direction is connected to the third conductive portion.

13. The semiconductor device according to claim 12, wherein the second conductive portion extends in the second direction to a position along the second direction that is beyond the third conductive portion and the end of the first conductive portion along the second direction.

14. The semiconductor device according to claim 11,
wherein the first conductive portion includes an impurity of the first conductivity type or the second conductivity type, and
wherein the second conductive portion does not include the impurity.

15. The semiconductor device according to claim 11,
wherein the first conductive portion and the second conductive portion include an impurity of the first conductivity type or the second conductivity type, and
wherein a concentration of the impurity in the first conductive portion is greater than a concentration of the impurity in the second conductive portion.

16. The semiconductor device according to claim 11,
wherein the conductive layer further includes a fourth conductive portion extending in the second direction,
wherein an end portion of the fourth conductive portion disposed at an end of the fourth conductive portion along the second direction is connected to the third conductive portion, and
wherein the first conductive portion is connected to the fourth conductive portion.

17. The semiconductor device according to claim 11, wherein the third conductive portion is over the second region of the first semiconductor layer in the third direction.

18. A semiconductor device, comprising:
a first semiconductor region of a first conductivity type including a first region and a second region surrounding the first region;

a second semiconductor region of a second conductivity type on the first region of the first semiconductor region;
a third semiconductor region of the first conductivity type on a portion of the second semiconductor region;
a conductive layer including:
  a first conductive portion on the first region of the first semiconductor region, a first insulating portion being between the first conductive portion and the first semiconductor region,
  a second conductive portion on the second region of the first semiconductor region and extending in a second direction, which is perpendicular to a first direction, towards the second semiconductor region from the first region, and
  a third conductive portion connected between the first conductive portion and the second conductive portion and extending in a third direction intersecting the first and second direction, a width of the second conductive portion along the first direction being less than a width of the third conductive portion along the second direction, the second conductive portion having a thickness along the third direction that is the same as a thickness of the second conductive portion along the third direction;
a gate electrode disposed above the first conductive portion in the third direction, the first insulating portion being between the gate electrode and the first conductive portion in the third direction, the gate electrode facing the second semiconductor region with a second insulating portion being between the gate electrode and the second semiconductor region in the third direction; and
a first electrode above the conductive layer in the third direction and electrically connected to the third semiconductor region and the conductive layer, the second conductive portion electrically connecting the first electrode to the third conductive portion.

19. The semiconductor device according to claim 18, wherein the first conductive portion and the gate electrode extend in the second direction, and an end portion of the first conductive portion disposed at an end of the first conductive portion along the second direction is connected to the third conductive portion.

20. The semiconductor device according to claim 18, wherein the conductive layer further includes a fourth conductive portion extending in the second direction,
wherein an end portion of the fourth conductive portion disposed at an end of the fourth conductive portion along the second direction is connected to the third conductive portion, and
wherein the first conductive portion is connected to the fourth conductive portion.

* * * * *